(12) United States Patent
Nirshl et al.

(10) Patent No.: US 7,515,455 B2
(45) Date of Patent: Apr. 7, 2009

(54) HIGH DENSITY MEMORY ARRAY FOR LOW POWER APPLICATION

(75) Inventors: Thomas Nirshl, Essex Junction, VT (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/650,244

(22) Filed: Jan. 5, 2007

(65) Prior Publication Data

US 2007/0279962 A1 Dec. 6, 2007

Related U.S. Application Data

(63) Continuation-in-part of application No. 11/378,201, filed on Mar. 17, 2006, now Pat. No. 7,474,555.

(51) Int. Cl.
G11C 11/00 (2006.01)

(52) U.S. Cl. .......... 365/148; 365/163; 365/46; 365/100; 365/145; 365/158; 365/63

(58) Field of Classification Search .......... 365/46, 365/148, 100, 145, 158, 63, 163
See application file for complete search history.

(56) References Cited

U.S. PATENT DOCUMENTS

| | | | |
|---|---|---|---|
| 6,150,253 A * | 11/2000 | Doan et al. | 438/597 |
| 6,426,891 B1 * | 7/2002 | Katori | 365/175 |
| 6,797,979 B2 * | 9/2004 | Chiang et al. | 257/4 |
| 7,272,035 B1 * | 9/2007 | Chen et al. | 365/158 |
| 2003/0132501 A1 * | 7/2003 | Gill et al. | 257/505 |
| 2005/0105327 A1 * | 5/2005 | Nazarian | 365/158 |
| 2006/0145135 A1 | 7/2006 | Huang et al. | |
| 2006/0245227 A1 * | 11/2006 | Nazarian | 365/46 |
| 2007/0103971 A1 * | 5/2007 | Gruening-Von Schwerin et al. | 365/163 |

OTHER PUBLICATIONS

"A 512Mb NROM Data Storage Memory with 8MB/s data rate", E. Maayan, et al., ISSCC, 2002.
"Can NROM, a 2 Bit, Trapping Storage NVM Cell, Give a Real Challenge to Floating Gate Cells", Boaz Eltan, et al, ICSSDM, 1999.
"Highly Reliable 50 nm Contact Cell Technology for 256Mb PRAM", S.J. Ahn, et al., VLSI, 2005.
"Ovonics Unified Memory-A High Performance Nonvolatile Memory Technology for Stand Alone Memory and Embedded Applications", M. Gill, et al., ISSCC, 2002.

* cited by examiner

Primary Examiner—Huan Hoang
Assistant Examiner—Fernando N Hidalgo
(74) Attorney, Agent, or Firm—Dicke, Billig & Czaja, PLLC

(57) ABSTRACT

A memory device includes a first bit line in a first conducting layer and a second bit line parallel to the first bit line. The second bit line is in a second conducting layer. The memory device includes a MOS select transistor and a word line coupled to a gate of the MOS select transistor. The word line is at an angle with respect to the first bit line and the second bit line. The memory device includes a first resistive memory element coupled between a source of the MOS select transistor and the first bit line. The memory device includes a second resistive memory element coupled between a drain of the MOS select transistor and the second bit line.

25 Claims, 16 Drawing Sheets

HIGH DENSITY MEMORY ARRAY FOR LOW POWER APPLICATION

CROSS-REFERENCE TO RELATED APPLICATIONS

This Utility Patent Application is a continuation-in-part of U.S. patent application Ser. No. 11/378,201 entitled "HIGH DENSITY MEMORY ARRAY FOR LOW POWER APPLICATION", filed Mar. 17, 2006 now U.S. Pat. No. 7,474,555.

FIELD OF INVENTION

The present invention relates generally to a memory cell array architecture and methods of addressing cells in such an architecture, and more particularly to a virtual ground architecture for a phase change memory device.

BACKGROUND

In the case of conventional memory devices, in particular conventional semiconductor memory devices, it is sometimes common to differentiate between functional memory devices (e.g., PLAs, PALs, etc.) and table memory devices. For example, some table memory devices include ROM devices (Read Only Memory) such as PROMs, EPROMs, EEPROMs, flash memories, etc., and RAM devices (Random Access Memory or read-write memory) such as DRAMs and SRAMs.

In the case of SRAMs (Static Random Access Memory), individual memory cells consist of several, for example, six, transistors configured as a cross-coupled latch. In the case of DRAMs (Dynamic Random Access Memory), generally only one single, correspondingly controlled capacitive element (e.g., the gate-source capacitance of a MOSFET) is employed, wherein charge may be stored in the capacitance. The charge in a DRAM, however, remains for only a short time, and a periodic refresh must be performed, to maintain a data state. In contrast to the DRAM, the SRAM requires no refresh, and the data stored in the memory cell remains stored as long as an appropriate supply voltage is fed to the SRAM. Both SRAMs and DRAMs are considered volatile memories, wherein a data state is only retained as long as power is supplied thereto.

In contrast to volatile memory, non-volatile memory devices (NVMs), e.g., EPROMs, EEPROMs, and flash memories, exhibit a different property, wherein the stored data is retained even when the supply voltage associated therewith is switched off. This type of memory has several advantages for various types of mobile communications devices such as, for example, in an electronic rolodex on cell phones, wherein the data therein is retained even when the cell phone is turned off.

One type of non-volatile memory that has recently been developed is called resistive or resistively switched memory devices. In such a resistive memory, a memory material positioned between two appropriate electrodes (i.e., an anode and a cathode) is placed, by appropriate switching processes, in a more or less conductive state, wherein the more conductive state corresponds to a logic "1", and the less conductive state corresponds to a logic "0", for example (or vice versa). Suitable resistive memories can be, for example, perovskite memory, as described in W. W. Zhuang et al., "Novel Colossal Magnetoresistive Thin Film Nonvolatile Resistance Random Access Memory (RRAM)", IEDM 2002, resistive switching in binary oxides (OxRAM), as, for example, described in I. G. Baek et al., "Multi-layer crosspoint binary oxide resistive memory (OxRAM) for post-NAND storage application", IEDM 2005, or phase change memory.

In the case of phase change memory, an appropriate chalcogenide compound (e.g., a GeSbTe or an AgInSbTe compound) may, for instance, be used as the active material that is positioned between the two corresponding electrodes. The chalcogenide compound material can be placed in an amorphous, i.e., relatively weakly conductive, or a crystalline, i.e., relatively strongly conductive state by means of appropriate switching processes, and thus behaves like a variable resistance element, which as highlighted above, may be exploited as differing data states.

In order to achieve a change in the phase change material from an amorphous state to a crystalline state, an appropriate heating current can be applied to the electrodes, wherein the current heats the phase change material beyond the crystallization temperature thereof. This operation is sometimes called a SET operation. Similarly, a change of state from a crystalline state to an amorphous state may be achieved by application of an appropriate heating current pulse, wherein the phase change material is heated beyond the melting temperature thereof, and the amorphous state is obtained during the rapid cooling process thereof. This operation is sometimes called a RESET operation. The combination of SET and RESET operations is one means by which data can be written to a phase change memory cell.

Conventionally, phase change memory devices were organized in one or more arrays of phase change cells in a core area of the device, wherein each phase change memory cell was composed of a phase change memory element coupled to a selection switching device. One conventional arrangement is illustrated in FIG. 1, wherein a phase change element 10 is coupled between a bit line 12 and a bipolar select transistor 14. A word line 16 is coupled to the base terminal of the transistor 14. By properly addressing the bit line 12 and word line 16 associated therewith, data may be written thereto and read therefrom. An array of phase change memory cells configured in the manner described above is sometimes called a NOR type memory array.

It is often desirable to increase the density in a memory, that is, to increase the amount of data that can be stored within a given area. In some instances, attempts have been made to increase memory density by storing multiple bits of data within a single memory cell. Such a solution in phase change memory cells, however, disadvantageously results in an increase in power consumption when reading data from or writing data to the cell. Consequently, another solution to increase the memory density is to reduce the physical size of an individual memory cell.

One attempt to reduce the size of an individual phase change memory cell employed a cross-point array-like structure, where a bit line and a word line are used to select a phase change cell using an additional two-port element that was similar to a diode. This solution, however, suffers from a variety of disadvantages such a signal integrity, and difficulties arise in the integration of the diode-like structure into a standard process flow. Therefore there is a need in the art for improved memory cell architectures for phase change memory devices.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof.

Rather, the primary purpose of the summary is to present some concepts of the invention in a simplified form as a prelude to the more detailed description that is presented later.

The present invention is directed to a phase change memory cell array architecture and a method of addressing such an architecture. In one embodiment of the invention, a phase change memory array is configured in a virtual ground architecture and comprises a plurality of MOS select transistors coupled together in series to form a transistor string. Each of the MOS select transistors in the string has a gate terminal that is coupled to an individual, unique word line. The MOS transistors can be planar transistors or 3D structures, such as FinFETs, tri-gate, or multi-gate transistors. The array further comprises a plurality of phase change elements that are coupled between a unique bit line and a source region of a respective MOS select transistor in the transistor string. Data associated with a respective phase change element is sensed in the architecture of the invention by sensing an impact of a resistance condition of the phase change element on the threshold voltage of the MOS select transistor.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description.

The elements of the drawings are not necessarily to scale relative to each other. Like reference numerals designate corresponding similar parts.

DETAILED DESCRIPTION

Figure 1:
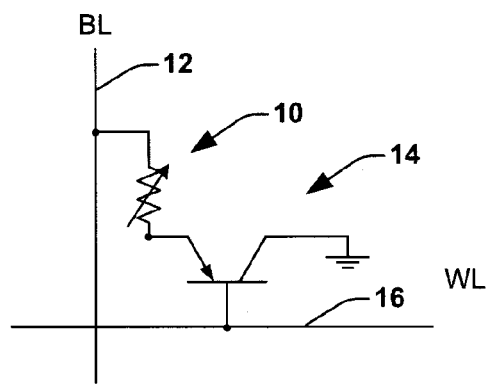
FIG. 1 is a prior art schematic diagram illustrating a conventional phase change memory cell in a NOR-type architecture.
Figure 2:
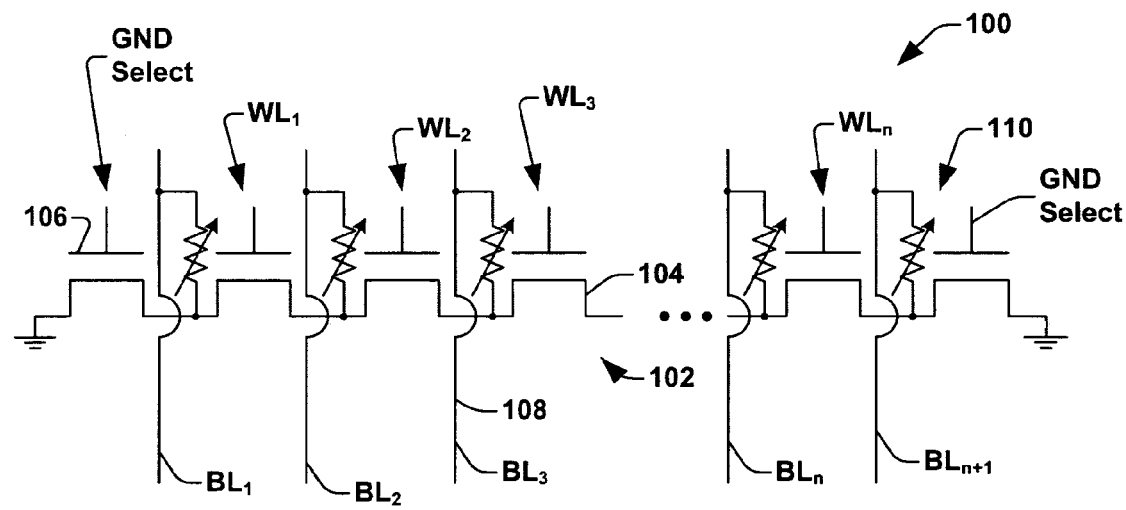
FIG. 2 is a schematic diagram illustrating a portion of a phase change memory array configured in a virtual ground array architecture according to one embodiment of the invention.

One or more implementations of the present invention will now be described with reference to the attached drawings, wherein like reference numerals are used to refer to like elements throughout. The invention relates to a virtual ground memory architecture and a method of addressing the same. Turning to FIG. 2, a schematic diagram is provided illustrating one page or row 100 of a phase change memory architecture according to the invention. The row 100 of memory cells comprises a transistor string 102 of a plurality of series-connected MOS select transistors 104. In the illustrated embodiment, the MOS select transistors 104 are coupled to one another in series by sharing a source/drain diffusion in a semiconductor body. In the illustrated embodiment example, each end of the transistor string 102 is selectively coupled to a low potential such as circuit ground through a ground select transistor 106.

Still referring to FIG. 2, each of the MOS select transistors 104 have a unique bit line 108 associated therewith and is coupled thereto through an associated phase change element 110. In FIG. 2, the phase change elements are illustrated as variable resistors for ease of illustration, since such elements are configured to change a conductance thereof that is indicative of a state of the memory cell. As highlighted supra, based upon a current passed through the phase change element, the element can be altered between polycrystalline and amorphous states.

In contrast to conventional virtual ground memory architectures, where all the gate terminals of memory devices along a given row are coupled to a common word line, the virtual ground architecture of the invention has a gate terminal of each of the MOS select transistors 104 coupled to a unique word line. Accordingly, in one example the gate of MOS select transistor #1 is coupled to $WL_1$, the gate of MOS select transistor #2 is coupled to $WL_2$, and so on. As will be appreciated infra, the virtual ground architecture facilitates a reading of a phase change memory cell by exploiting the body effect of the associated MOS select transistor.

As is known for a conventional MOS type transistor device, the body portion (sometimes the substrate) of the transistor is often coupled to the source terminal of the transistor, which results in the pn junction between the substrate and the induced channel having a constant bias equal to zero. In such instances, the body does not impact device operation and can be ignored. However, in accordance with the invention, the body of each MOS select transistor in the transistor string is not coupled to the source terminal, but is instead coupled to the most negative supply voltage or some other suitable potential in the circuit. The resulting bias voltage between the source and body ($V_{SB}$) does have an impact on transistor device operation and this "body effect" is exploited by the invention. More particularly, since $V_{SB}$ impacts the channel depth in the respective MOS select transistor, increasing $V_{SB}$ depletes the channel of charge carriers while decreasing $V_{SB}$ increases such carriers. Consequently, the body terminal can be thought of as acting like a second gate for the transistor and consequently impacts the threshold voltage ($V_t$) of the transistor device. The relationship between $V_{SB}$ and $V_t$ can be characterized as follows:

$$V_t \sim K + \gamma (V_{SB})^{1/2} \quad \text{(equation 1)},$$

wherein K is a constant, and γ is a device parameter that depends upon substrate doping and other device parameters. However, as can be seen above from equation (1), the body effect can alter the threshold voltage characteristics of the MOS select transistor.

The present invention exploits the body effect as described above by employing the resistance of the respective phase change element to alter the effective $V_{SB}$ of the associated MOS select transistor. Therefore in one state, the phase change element is less resistive, causing a first $V_{SB}$ and a first $V_t$ (e.g., $V_{t1}$), while in another state is more resistive, causing a second $V_{SB}$ and a second $V_t$ (e.g., $V_{t2}$). As can be seen from equation (1), by altering the state of the phase change element, the threshold voltage ($V_t$) of the MOS select transistor is altered. Consequently, by placing a read voltage on the gate of the MOS select transistor that is greater than $V_{t1}$ and less than $V_{t2}$, a data state of the phase memory cell can be ascertained by evaluating the current of the transistor.

Figure 3A:
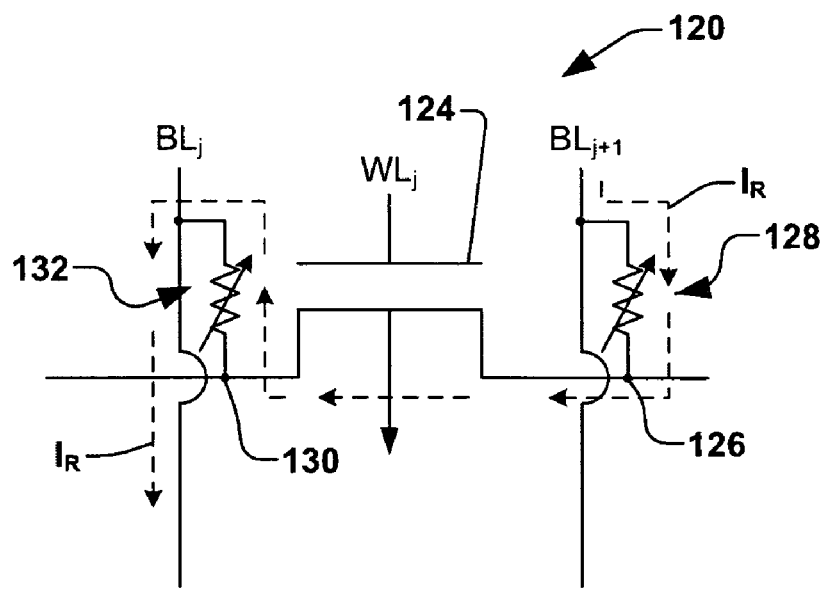
FIG. 3A is a schematic diagram illustrating a portion of a phase change memory array according to another embodiment of the invention in a read operation.
Figure 3B:
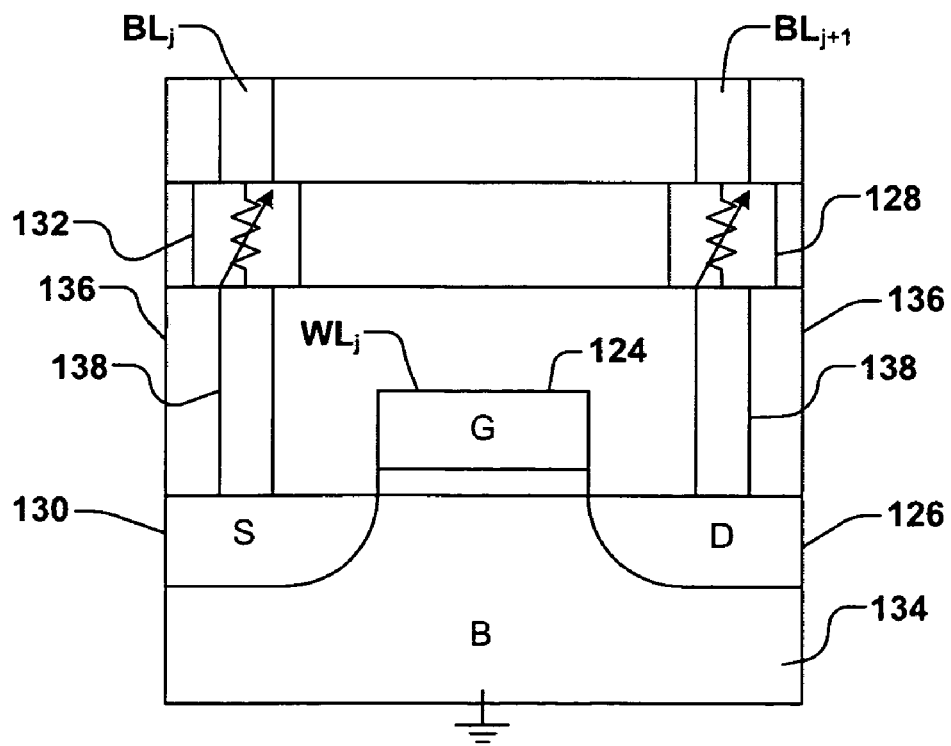
FIG. 3B is a fragmentary cross section of a portion of a phase change memory array in a virtual ground architecture according to another embodiment of the invention.

Turning to FIGS. 3A and 3B, a phase change memory cell is illustrated at reference numeral 120 according to one example embodiment of the invention. The $j^{th}$ MOS select transistor 122 in a row or page has a gate terminal 124 coupled to a unique word line $WL_j$, a drain terminal 126 coupled to a neighboring bit line $BL_{j+1}$ via a neighboring phase change element 128, and a source terminal 130 coupled to the cell's associated bit line $BL_j$ through its respective phase change element 132. As illustrated in the example of FIG. 3B, the MOS select transistor is formed on and in a semiconductor body 134, and is coupled to the phase change elements 128, 132 in an upper dielectric layer 136 through contacts 138.

Figure 4:
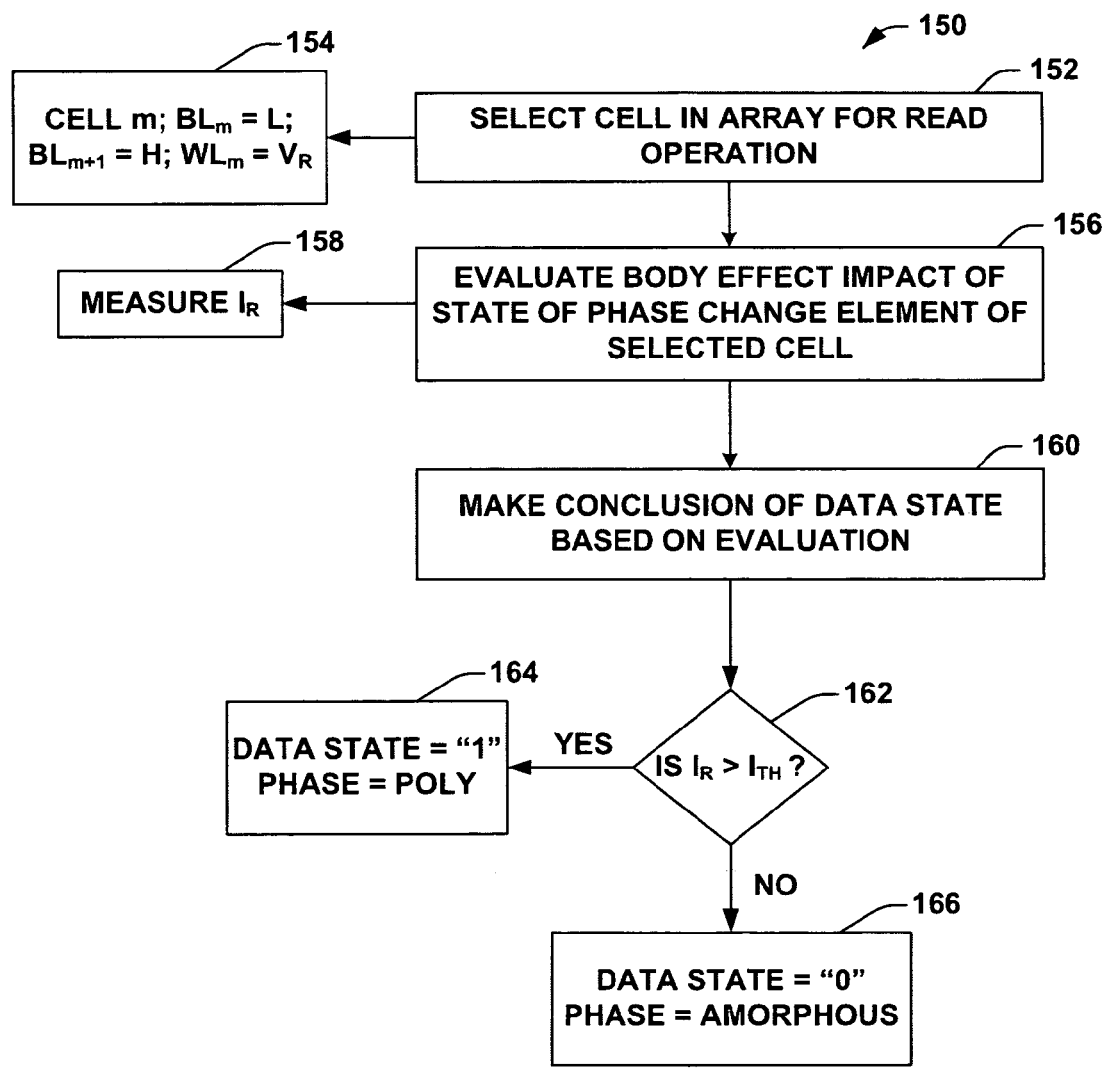
FIG. 4 is a flow chart diagram illustrating a method of addressing a virtual ground phase change memory array in a read context according to yet another embodiment of the invention.

A method of reading a state of the phase change memory cell 120 of FIGS. 3A and 3B in the virtual ground architecture 100 of FIG. 2 is illustrated in the flow chart of FIG. 4 at reference numeral 150. While the method 150 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

Initially, at 152 a phase change memory cell is selected to read data therefrom. In one example embodiment, a decoder circuit (not shown) may be employed to properly bias the appropriate word line and bit lines for the selected cell. For example, as illustrated at 154 of FIG. 4, if memory cell "m" is selected within a given row (such as the row illustrated in FIG. 2), the $m^{th}$ word line ($WL_m$) is coupled to a read voltage level $V_R$ (e.g., a value greater than $V_{t1}$ and less than $V_{t2}$), the bit line associated with the source terminal of the $m^{th}$ MOS select transistor ($BL_m$) is coupled to a low potential (L), and the bit line associated with the drain terminal of the $m^{th}$ MOS select transistor ($BL_{m+1}$) is coupled to a high potential (H). In such a bias arrangement, current ($I_R$) will flow through the selected MOS transistor as a function of the cell threshold voltage, as illustrated in FIG. 3A.

At 156 of FIG. 4 the body effect impact of a state of the phase change element associated with the $m^{th}$ cell is evaluated, for example, by measuring the current through the MOS transistor at 158. In one example, the current $I_R$ is detected with a sense amplifier circuit, however, any manner of evaluating the body effect impact may be employed and is contemplated by the present invention. Based on the measured current $I_R$, for example, a conclusion is made of the data state of the selected cell based on the evaluation at 160 of FIG. 4. In one example embodiment, the conclusion is made by comparing the measured current $I_R$ to a threshold current $I_{TH}$ at 162, wherein the level of the threshold current is selected to differentiate between actual conduction of the MOS transistor and transistor leakage.

If the measured current $I_R$ is greater than the threshold $I_{TH}$ at 162, then the body effect of the phase change element is small and $V_t = V_{t1}$. Consequently, the applied read voltage $V_R$ at the gate is greater than $V_{t1}$, and the MOS select transistor conducts an appreciable amount of current. Consequently, the phase change element is in the polycrystalline state, and the data read is a "1" at 164, for example. Conversely, if the measured current $I_R$ is less than the threshold $I_{TH}$ at 162, then the body effect of the phase change element is significant, and $V_t = V_{t2}$. Consequently, the applied read voltage $V_R$ at the MOS select transistor gate is less than $V_{t2}$, and the transistor does not appreciably conduct (e.g., any detectable current is attributable to leakage). Therefore the phase change element is in the amorphous state, and the data read is a "0" at 166, for example. In one embodiment, the word line voltage to read the contents of the memory cell is larger than the threshold voltage in either state. The overdrive voltage (i.e., the difference between applied gate voltage and threshold voltage), determines the current drawn by the memory cell. The difference in current is evaluated by means of a sensing circuit.

Referring briefly to FIGS. 2 and 3A, it should be noted that, in one example, the MOS select transistors 104 are symmetrical devices, meaning that the source and drain regions/terminals associated therewith are interchangeable. In another embodiment, the select transistors 104 are asymmetrical devices, which can be used to facilitate the distinction between the left and the right phase change element during read. Accordingly, in an another embodiment of the invention, the phase change element associated with the bit line to the right of a given MOS select transistor can be the bit line uniquely associated with the MOS select transistor by biasing the bit lines in the opposite fashion. For example, in FIG. 3A, instead of $BL_{j+1}$=H and $BL_j$=L with phase change element 132 being the read element, the bit lines may be biased in the opposite fashion, wherein $BL_{j+1}$=L and $BL_j$=H with the phase change element 128 being the read element. Further, as can be appreciated in FIG. 2, the last MOS select transistor (the transistor with gate terminal coupled to $WL_n$) has two phase change elements associated therewith. Consequently, one embodiment of the invention contemplates a decoder circuit to vary the biasing of the bit lines $BL_n$ and $BL_{n+1}$ appropriately in order to read both data bits.

Figure 5:
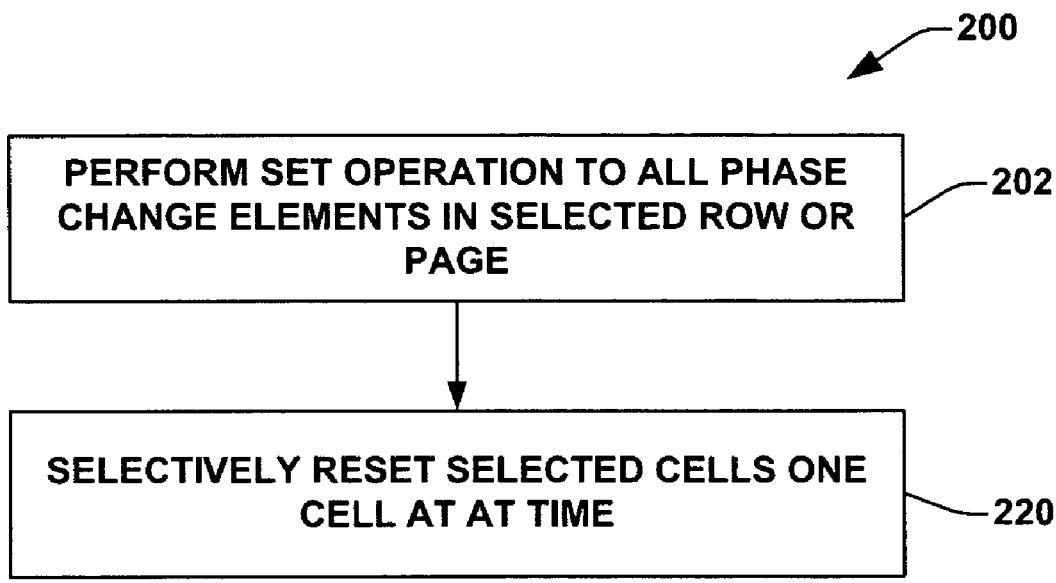
FIG. 5 is a flow chart diagram illustrating a method of addressing a virtual ground phase change memory array in a write context according to still another embodiment of the invention.

According to another embodiment of the invention, a method of addressing the virtual ground phase change memory of FIG. 2 is provided, as illustrated in FIG. 5 at reference numeral 200. The method 200 includes writing data to the page or row of memory cells, for example, the page of memory illustrated in FIG. 2. At 202, a SET operation is performed on all the phase change elements in the selected row or page. One manner in which such a SET operation may be performed is illustrated in FIGS. 6 and 7, respectively.

Figure 6:
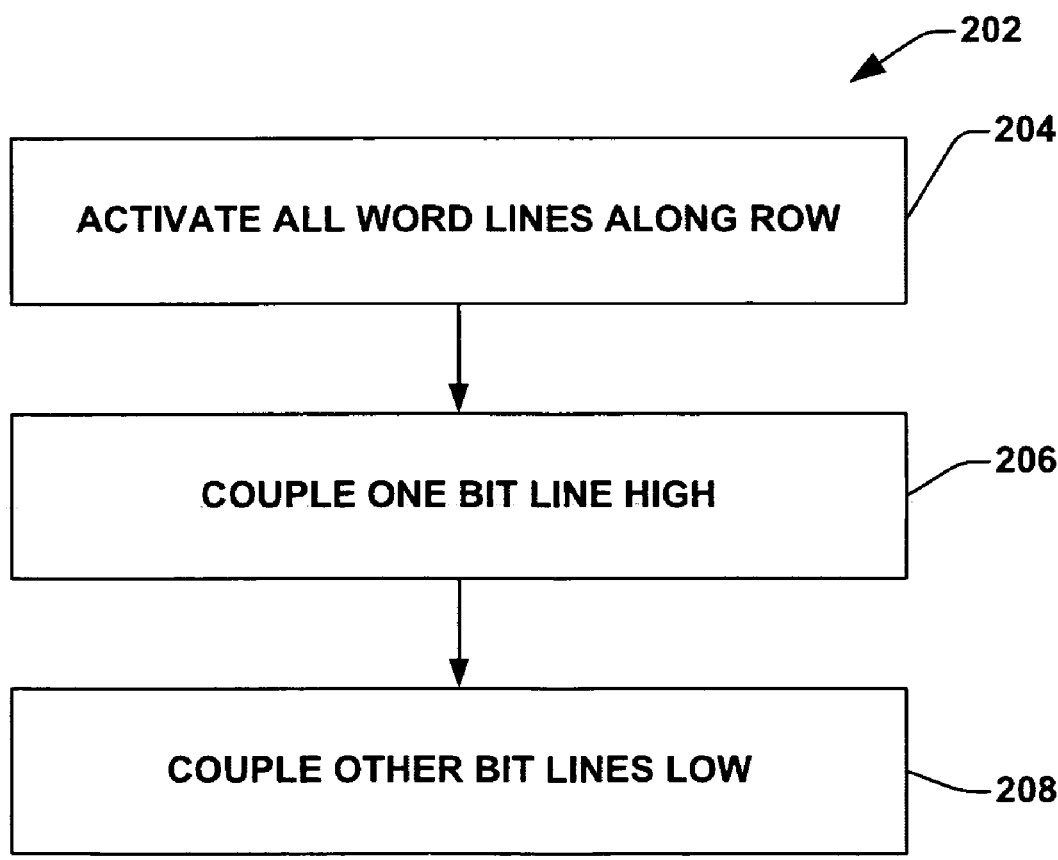
FIG. 6 is a flow chart diagram illustrating a method of setting a row or page of phase change memory cells in a virtual ground array architecture according to another embodiment of the invention.
Figure 7:
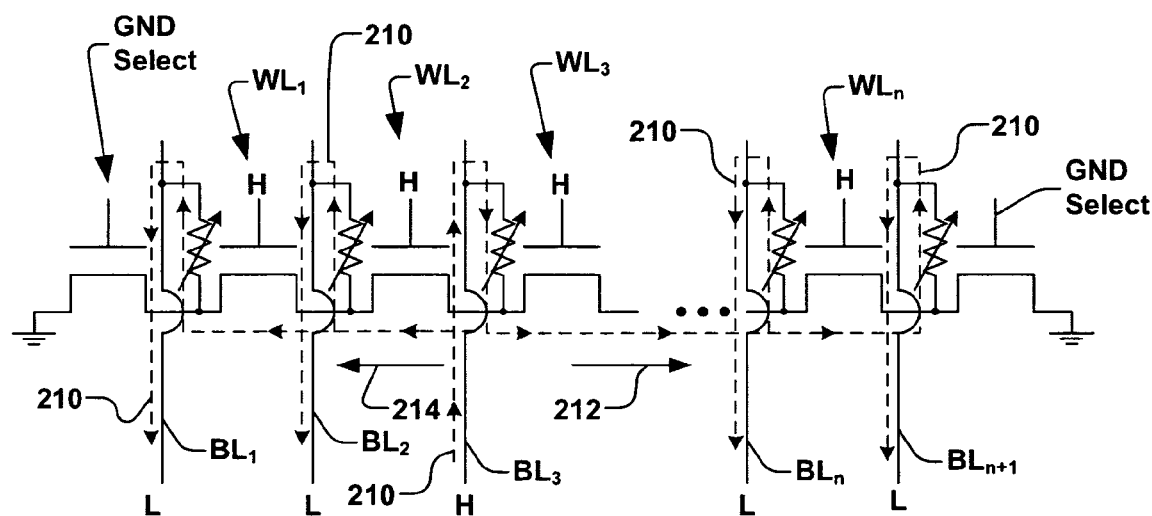
FIG. 7 is a schematic diagram illustrating current flow through a row or page of phase change memory cells in a virtual ground array architecture in a SET operation according to still another embodiment of the invention.

Referring to FIG. 6, the SET operation, in one embodiment, comprises activating all the word lines along the row, for example, by pulling each MOS select transistor gate terminal associated with the row high. One of the bit lines along the row then is coupled to a high potential (H) at 206, while the other bit lines along the row are coupled to a low potential (L) at 208, while the ground select transistors are turned off. Such a circuit condition is illustrated in FIG. 7. As can be seen in FIG. 7, with each word line pulled high (H), a current path 210 exists that starts at $BL_3$ (the one bit line that is pulled high), and passes through the phase change element associated therewith. Further, the current path 210 extends in both directions 212 and 214 along the MOS select transistor string and into each of the other bit lines because each of the other bit lines (e.g., $BL_1$, $BL_2$, $BL_n$, and $BL_{n+1}$) are pulled low (L). Consequently, the phase change elements associated with each of these bit lines have the SET current 210 pass therethrough. The SET current causes the phase change material to crystallize, forming a low resistance, polycrystalline state in each of the phase change elements along the entire row.

Figure 8:
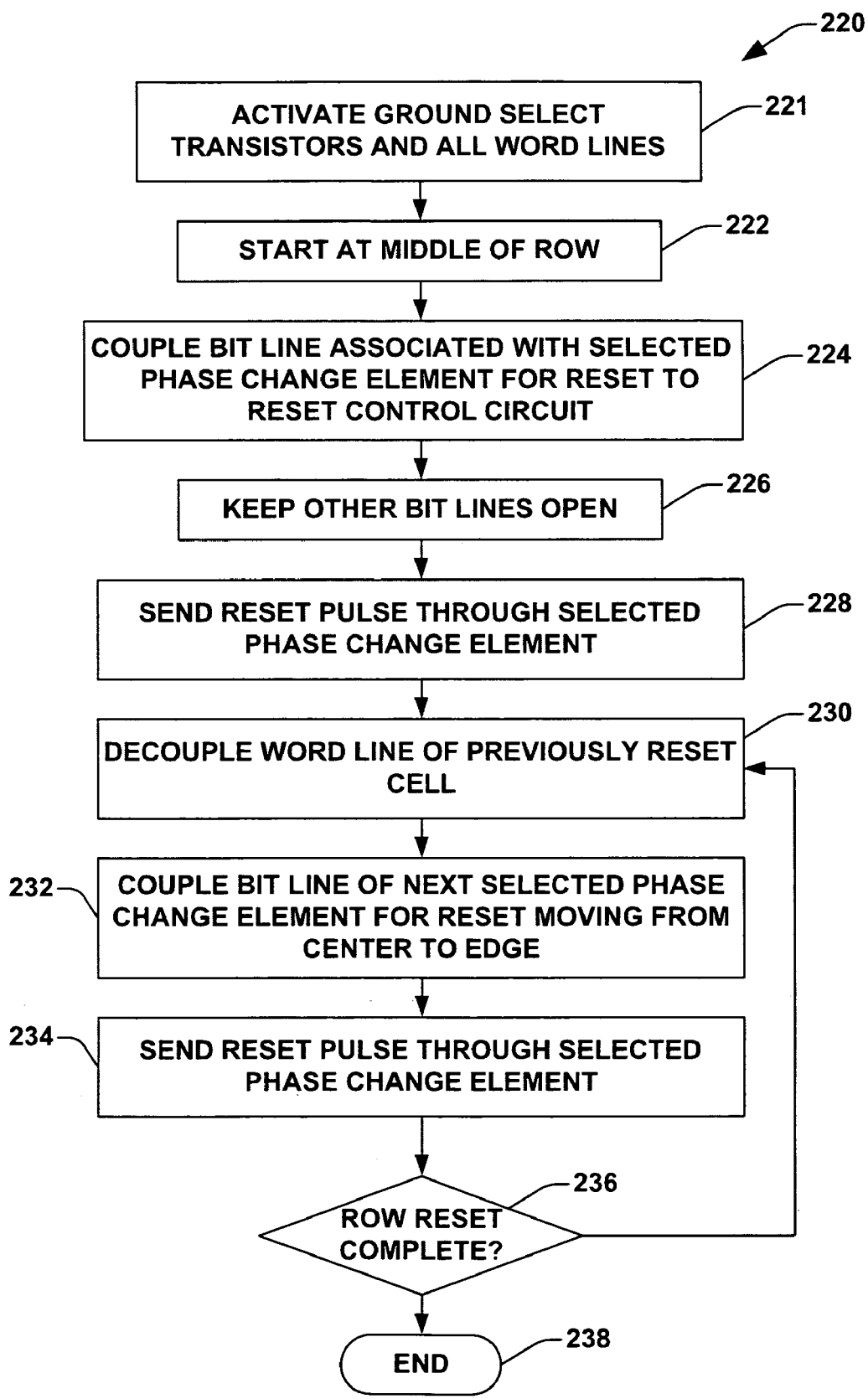
FIG. 8 is a flow chart diagram illustrating a method of resetting one or more selected phase change memory elements along a row or page of phase change memory in a virtual ground array architecture according to yet another embodiment of the invention.
Figure 9:
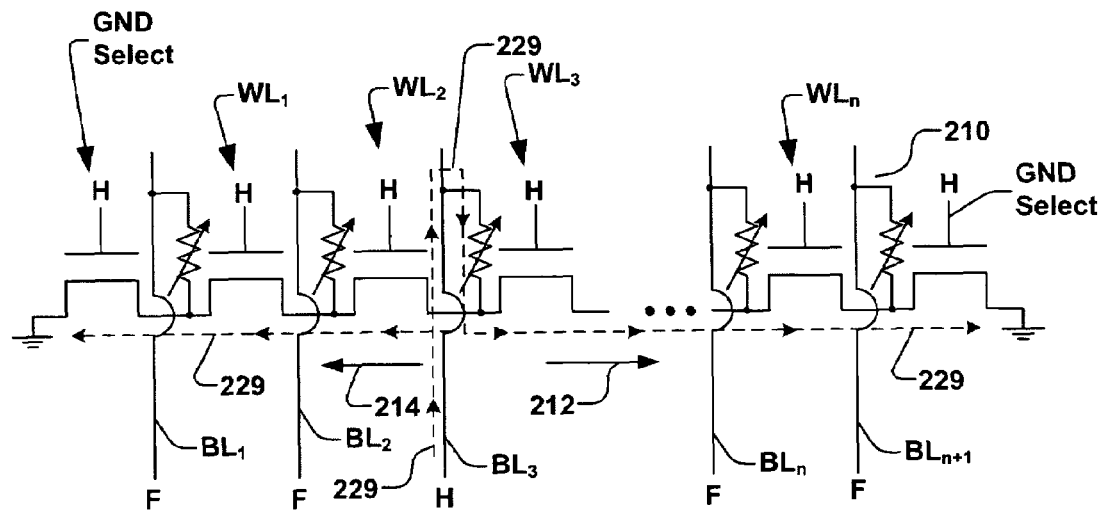
FIGS. 9 and 10 are schematic diagrams illustrating biasing and current flow conditions for a first and subsequent example RESET operations, respectively, for selected phase change memory elements in a row or page of cells configured in a virtual ground array architecture according to another embodiment of the invention.

Returning now to FIG. 5, the method 200 of addressing the phase change memory continues at 220, wherein selected cells in the row are RESET (i.e., writing a different data bit thereto). One example embodiment of such a RESET procedure is illustrated in FIG. 8. Initially, the ground select transistors at the end of the MOS transistor string are activated or turned on at 221, thereby coupling each end of the transistor string to a ground potential. From a schematic point of view such a bias condition is illustrated in FIG. 9, wherein the ground select transistors behave as activated switches. As will be fully appreciated infra, the procedure 220 starts, in one example, at a middle portion of the selected row at 222 (e.g., $B_{n+1}/2$), and the bit line associated with the phase change element in the row midpoint is selected by coupling such bit line to a reset control circuit (not shown) at 224. The bit lines associated with non-selected phase change elements are left open or floating (F) at 226. A RESET pulse is then transmitted through the selected phase change element along the selected bit line at 228. The RESET pulse is of sufficient magnitude to cause a melting of the phase change material. The falling edge of the pulse is short enough to cause the melted material to quickly cool or quench, thereby achieving a RESET state, wherein the phase change material is in a relatively high resistance, amorphous state. In one embodiment, the RESET pulse is optimized to achieve an intermediate state of the phase change material.

As can be seen in FIG. 9, with all non-selected bit lines (all bit lines except $BL_3$) floating (F), and the ground select transistors activated (gates coupled to high (H) potential), the reset current 229 passes through the selected bit line, the selected phase change element, and the activated MOS select transistors (e.g., in both directions 212 and 214) to ground, without impacting other non-selected phase change elements. In the above manner, each phase change element can be individually reset. In the above example, both ground select transistors are activated, wherein the current from the RESET pulse is distributed along directions 212 and 214 along the transistor string, however, in another example, only one of the ground select transistors may be activated, in which case all the RESET pulse current is conducted therethrough and thus in only one direction along the string.

Figure 10:
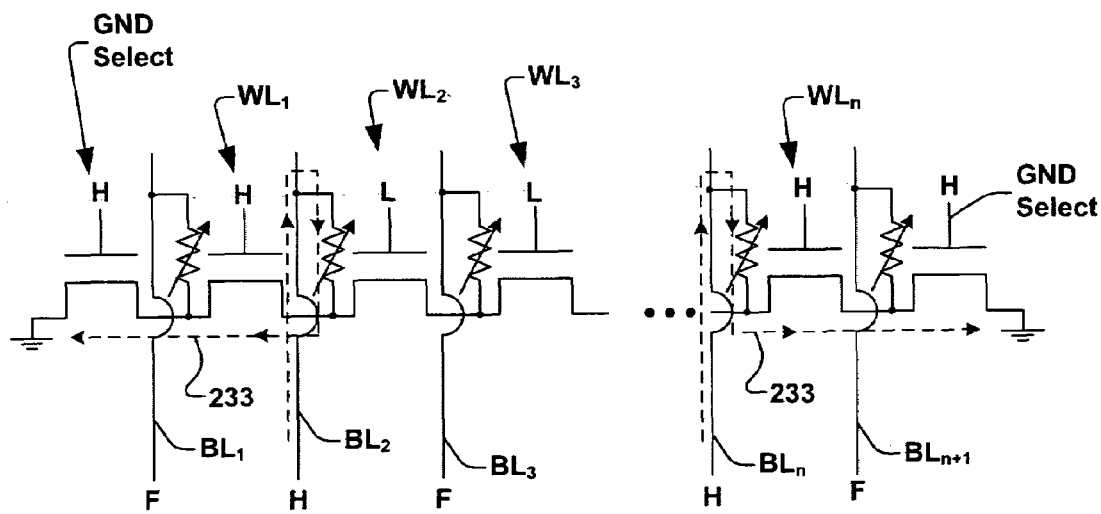

Still referring to FIG. 8, the word line associated with the previously selected phase change element is decoupled from the high potential and either pulled low or left to float at 230. The bit line associated with the next selected phase change element closest to the middle to the reset control circuit is selected at 232. In this instance, only the word lines between that cell and the closest edge (ground select transistor) need be coupled high. Concurrently, in an alternative embodiment the next closest selected cell (i.e., selected for RESET) to the previously selected cell on the opposite side (of the middle of the row) may similarly be selected, in which case the word lines between that selected cell and its respective edge of the row are activated, and the associated selected bit line is pulled high. The other bit lines remain floating. The RESET pulse current 233 is sent through the selected bit line(s) and through the respective phase change element(s) at 234. The RESET current 233 associated with resetting phase change elements $PC_2$ and $PC_n$ is illustrated in FIG. 10.

Still referring to FIG. 8, a query is performed at 236 to determine whether all selected cells have been reset. If the answer to the query is negative (NO at 236), then the RESET method 220 returns to 230, and the appropriate biasing for the next selected cell is performed for RESET thereof. Alternatively, if the answer to the query is positive (YES at 236), the RESET procedure ends at 238.

In accordance with yet another embodiment of the invention, a content-dependent write operation is contemplated. For example, in a situation where the number of cells to be RESET associated with a given page or row of memory is greater than a number cells to be SET, a bit may be toggled associated with such row or page to indicate an inversion of data when read therefrom. For example, if the number of phase change elements associated with a page of memory is 100, and the number of cells to be placed into a RESET state is greater than 50 (e.g., 75), a content-dependent write operation may be employed according to one embodiment of the invention. Since the RESET of such cells is performed one cell at a time, it will be more efficient to instead perform a RESET operation to the 25 phase change elements of such page that were not to be RESET, and then noting that the data in such row is inverted by toggling an "inversion bit" associated therewith. Subsequently, when the page is to be read, the state of the inversion bit is noted, and read operations are performed in accordance with the procedure highlighted above, and after data is retrieved, the resultant data word is then inverted to obtain the actual data.

Figure 11:
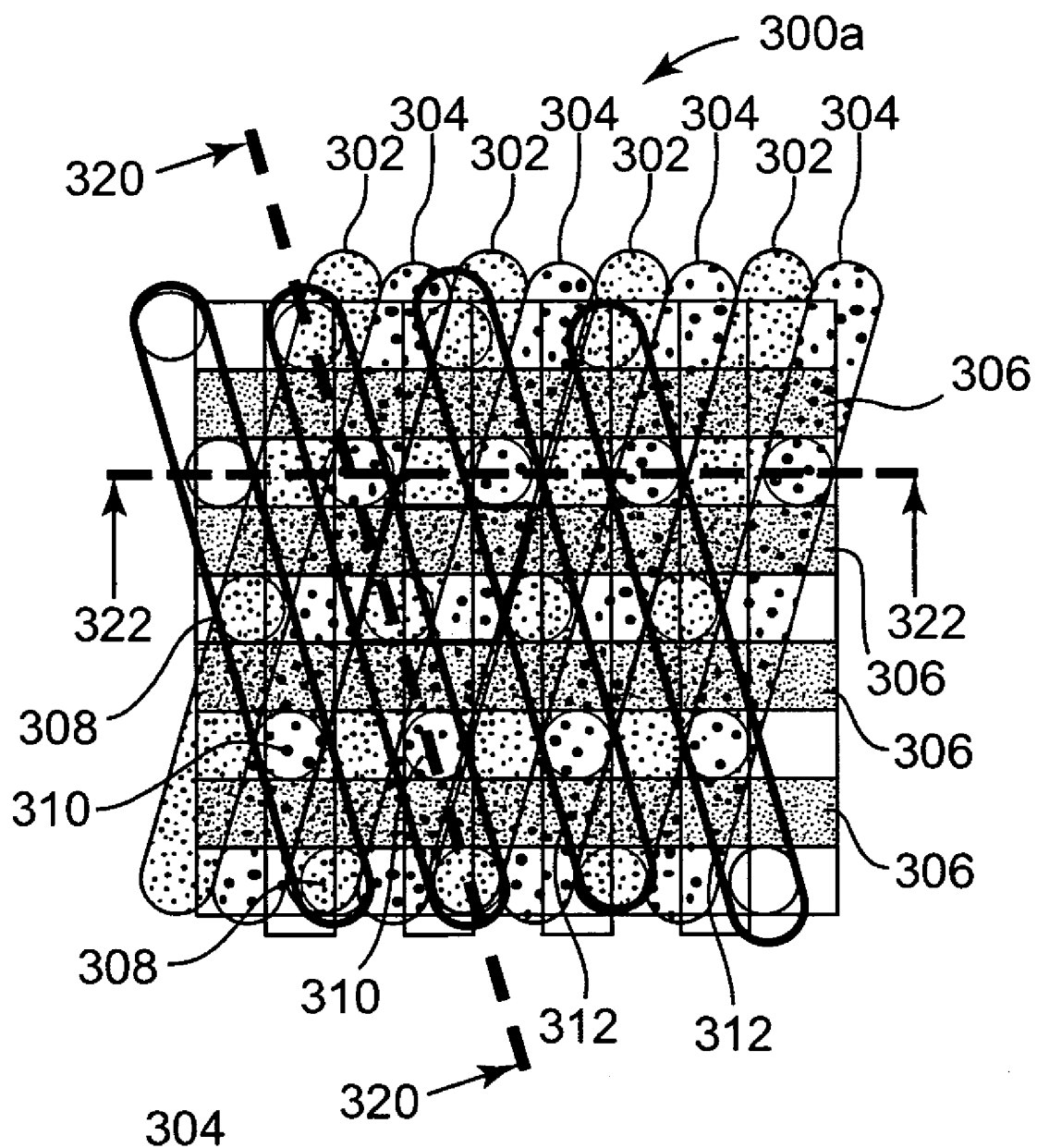
FIG. 11 is a diagram illustrating a top view of one embodiment of an array of phase change memory cells.

FIG. 11 is a diagram illustrating a top view of one embodiment of an array of phase change memory cells 300a, according to the present invention. Memory array 300a includes first bit lines 302, second bit lines 304, word lines 306, contacts 308, and contacts 310. First bit lines 302, second bit lines 304, and word lines 306 are straight lines. First bit lines 302 are parallel to and between second bit lines 304. First bit lines 302 and second bit lines 304 are at an angle to word lines 306. In one embodiment, first bit lines 302 and second bit lines 304 are at a +/−14 degree angle or other suitable angle. Word lines 306 are electrically coupled to the gates of transistors within each row. A phase change element is electrically coupled between one side of the source-drain path of each transistor and a first bit line 302 through a contact 308. A phase change element is electrically coupled between the other side of the source-drain path of each transistor and a second bit line 304 through a contact 310.

Word lines 306 comprise doped poly-Si, W, TiN, NiSi, CoSi, TiSi, $WSi_x$, or another suitable material. Contacts 308 and 310 comprise TiN, TaN, W, Al, TiSiN, TiAlN, TaSiN, TaAlN, WN, Cu, or other suitable material. First bit lines 302 and second bit lines 304 comprise Al, Cu, W, or other suitable metal.

Array of phase change memory cells 300a is scalable to $4F^2$, where F is the minimum feature size. In one embodiment, first bit lines 302 are formed in a first metallization layer and second bit lines 304 are formed in a second metallization layer different than the first metallization layer. In one embodiment, first bit lines 302 are formed in a higher metallization layer than second bit lines 304. In another embodiment, first bit lines 302 are formed in a lower metallization layer than second bit lines 304.

The active areas of transistors within array of phase change memory cells 300a are indicated at 312. Active areas 312 are configured diagonally across array of phase change memory cells 300a from a contact 308, to a contact 310, to another contact 308, and so on. Active areas 312 run from one contact 308 at a first bit line 302 across a first word line 306 to a second contact 310 at a second bit line 304, and from the contact 310 at the second bit line 304 across a second word line 306 to another contact 308 at another first bit line 302 and so on across the array.

Figure 12:
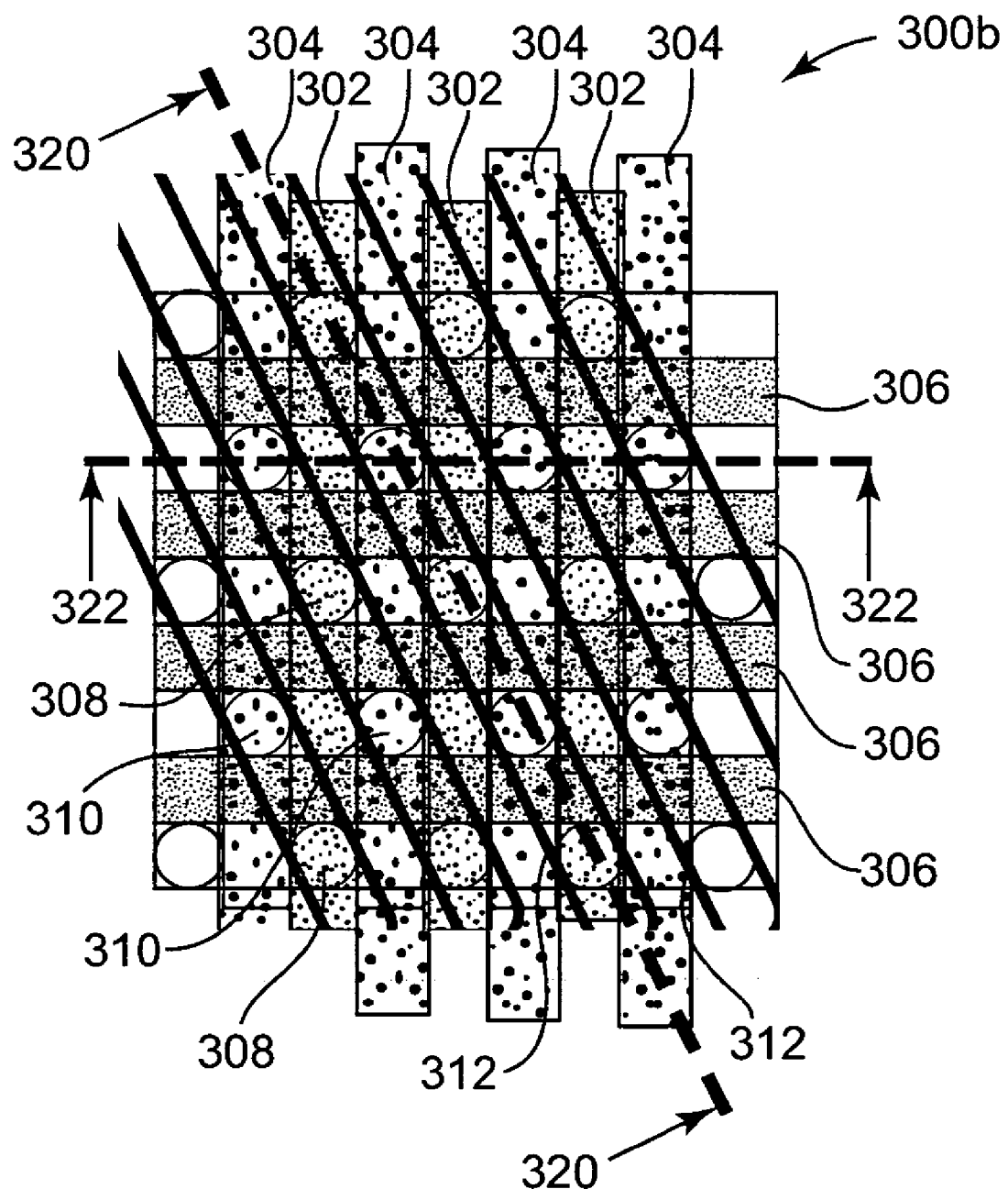
FIG. 12 is a diagram illustrating a top view of another embodiment of an array of phase change memory cells.

FIG. 12 is a diagram illustrating a top view of another embodiment of an array of phase change memory cells 300b. Array of phase change memory cells 300b is similar to array of phase change memory cells 300a previously described and illustrated with reference to FIG. 11, except that in array of phase change memory cells 300b first bit lines 302 and second bit lines 304 are perpendicular to word lines 306. In one embodiment, active areas 312 are at a +/−27 degree angle or other suitable angle.

Figure 13:
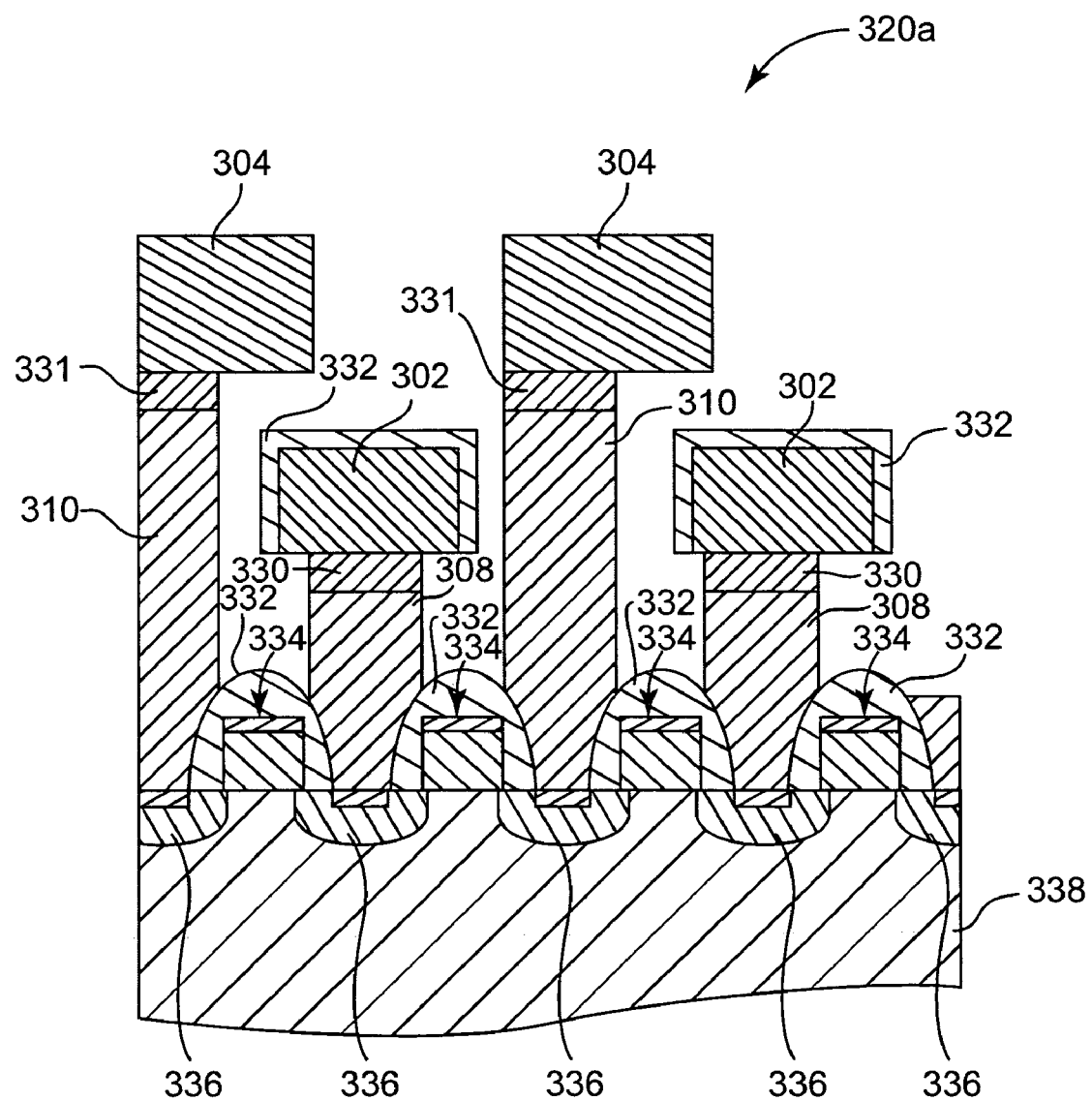
FIG. 13 is a diagram illustrating a simplified cross-sectional view of one embodiment of an array of phase change memory cells.

FIG. 13 is a diagram illustrating a simplified cross-sectional view 320a of one embodiment of array of phase change memory cells 300a and array of phase change memory cells 300b along cut 320 of an active area 312. View 320a includes substrate 338, transistors 334 including sources and drains 336, contacts 308, contacts 310, first phase change elements 330, second phase change elements 331, first bit lines 302, second bit lines 304, and dielectric material 332.

Transistors 334 for selecting first phase change elements 330 and second phase change elements 331 are formed on substrate 338. The gates of transistors 334 are electrically coupled to word lines 306. Dielectric material 332 is deposited over transistors 334 and word lines 306 to electrically isolate them from adjacent device features. Contacts 308 electrically couple one side 336 of the source-drain path of each transistor 334 to one side of a first phase change element 330. In one embodiment, contacts 308 are fabricated using a self-aligned processing technique. The other side of each first phase change element 330 is electrically coupled to a first bit line 302. Contacts 310 electrically couple the other side 336 of the source-drain path of each transistor 334 to one side of a second phase change element 331. In one embodiment, contacts 310 are fabricated using a self-aligned processing technique. The other side of each second phase change element 331 is electrically coupled to a second bit line 304. Dielectric material 332 caps first bit lines 302 to electrically isolate first bit lines 302 from adjacent device features.

First bit lines 302 are formed in a lower metallization layer than second bit lines 304. In another embodiment, first bit lines 302 are formed in a higher metallization layer than second bit lines 304. Likewise, first phase change elements 330 are formed in a lower layer than second phase change elements 331. In another embodiment, first phase change elements 330 are formed in a higher layer then second phase change elements 331. First phase change elements 330 and second phase change elements 331 are any suitable phase change elements, such as pillar, heater, or via type phase change elements.

Figure 14:
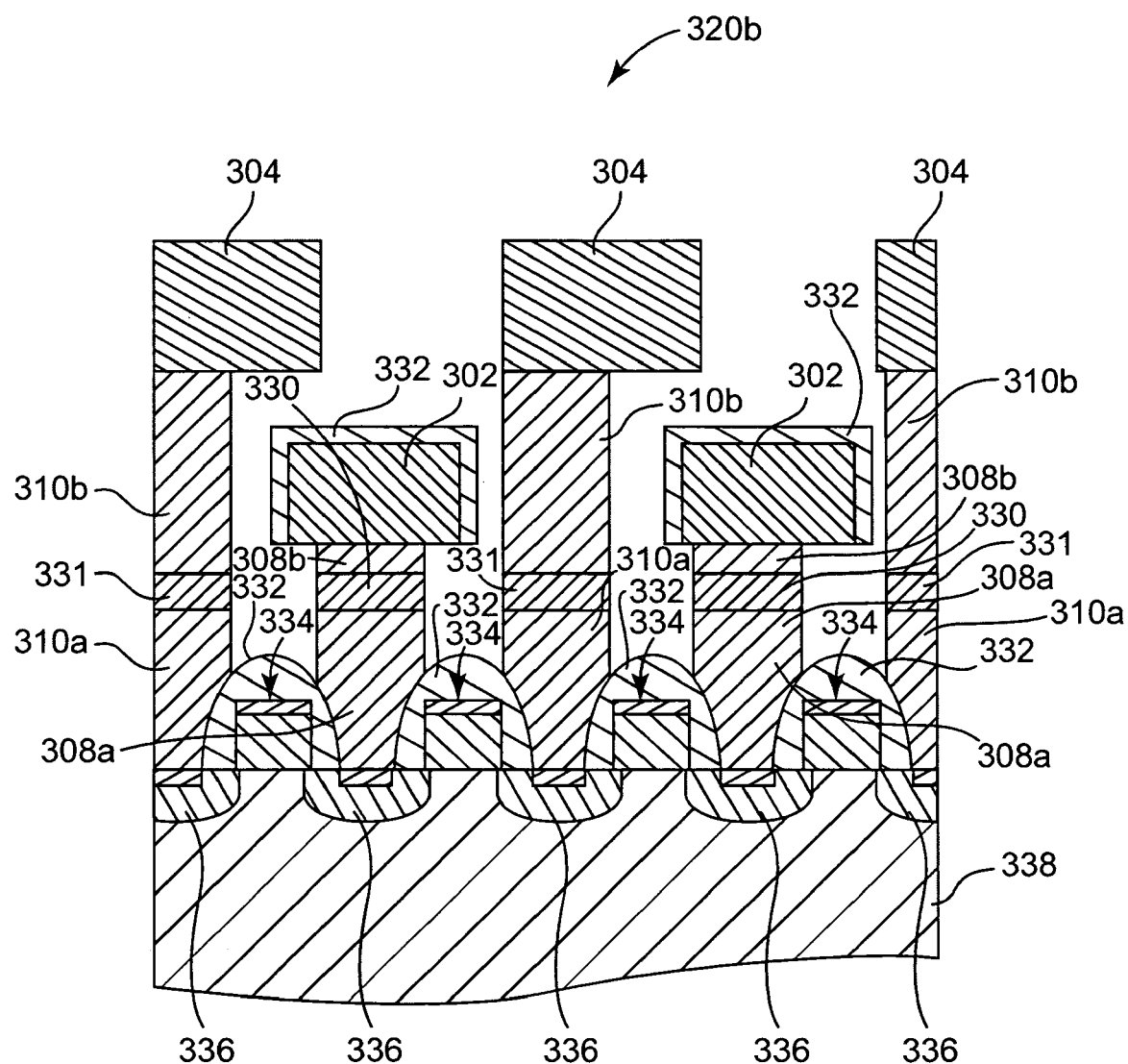
FIG. 14 is a diagram illustrating a simplified cross-sectional view of another embodiment of an array of phase change memory cells.

FIG. 14 is a diagram illustrating a simplified cross-sectional view 320b of another embodiment of array of phase change memory cells 300a and array of phase change memory cells 300b along cut 320 of an active area 312. View 320b is similar to view 320a previously described and illustrated with reference to FIG. 13, except that in view 320b, first phase change elements 330 and second phase change elements 331 are in the same layer. By forming first phase change elements 330 and second phase change elements 331 in the same layer, a single phase change material deposition and etching and/or planarizing process is used to form all the phase change elements.

Contacts 308a electrically couple one side 336 of the source-drain path of each transistor 334 to one side of a first phase change element 330. Contacts 308b electrically couple the other side of each first phase change element 330 to a first bit line 302. In one embodiment, contacts 308a and 308b are fabricated using a self-aligned processing technique. Contacts 310a electrically couple the other side 336 of the source-drain path of each transistor 334 to one side of a second phase change element 331. Contacts 310b electrically couple the other side of each second phase change element 331 to a second bit line 304. In one embodiment, contacts 310a and 310b are fabricated using a self-aligned processing technique.

Figure 15:
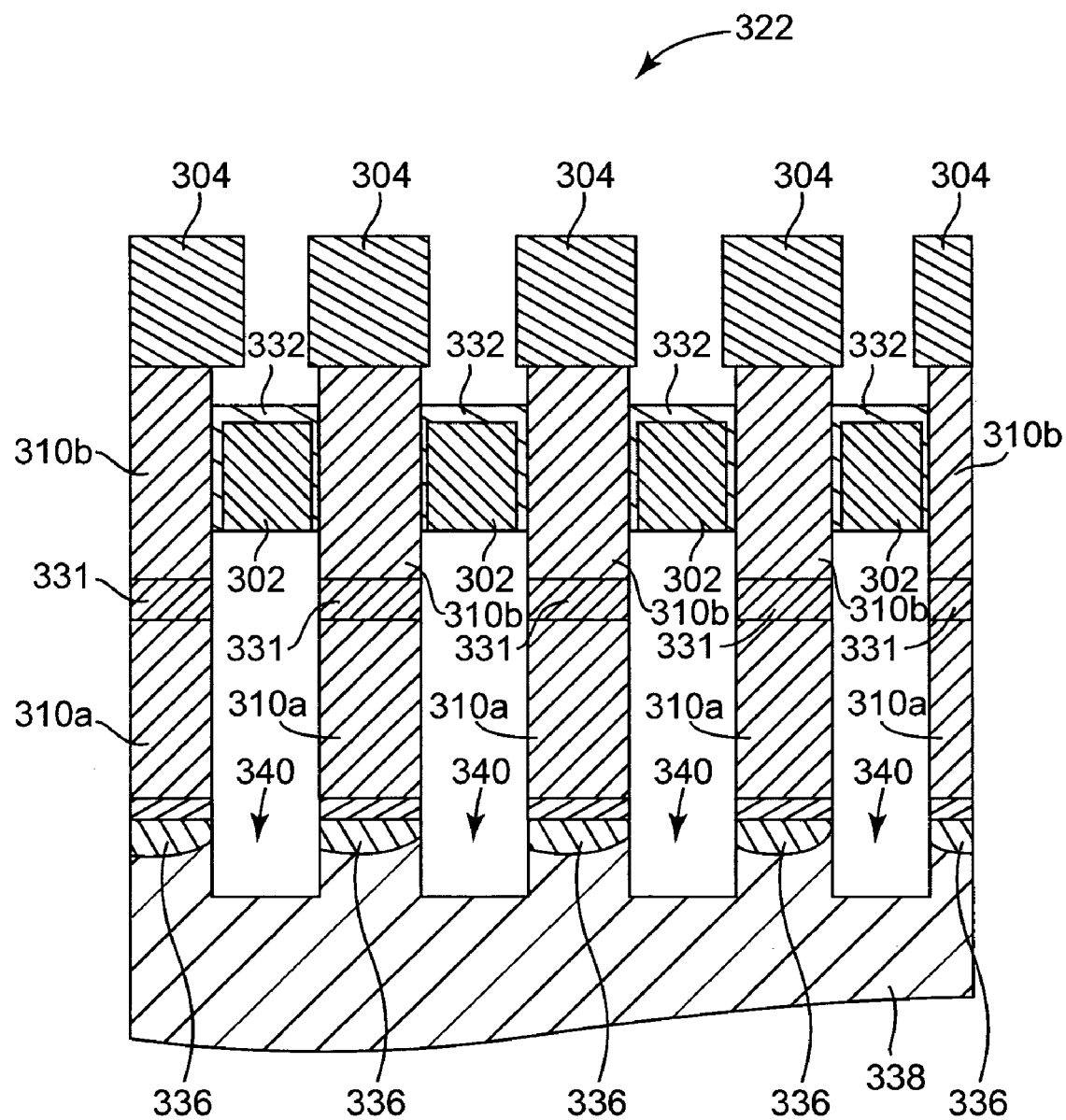
FIG. 15 is a diagram illustrating another simplified cross-sectional view of one embodiment of an array of phase change memory cells.

FIG. 15 is a diagram illustrating a simplified cross-sectional view 322 of one embodiment of array of phase change memory cells 300a and array of phase change memory cells 300b. View 322 includes substrate 338 including shallow trench isolation (STI) 340, source-drain regions 336, contacts 310a and 310b, second phase change elements 331, first bit lines 302, second bit lines 304, and dielectric material 332. In this embodiment, first phase change elements 330 (not visible) and second phase change elements 331 are in the same layer.

STI 340 electrically isolates adjacent source-drain regions 336 in substrate 338. Contacts 310a electrically couple one side 336 of the source-drain path of each transistor 334 to one side of a second phase change element 331. Contacts 310b electrically couple the other side of each second phase change element 331 to a second bit line 304. Dielectric material 332 electrically isolates first bit lines 302 from contacts 310b.

Figure 16:
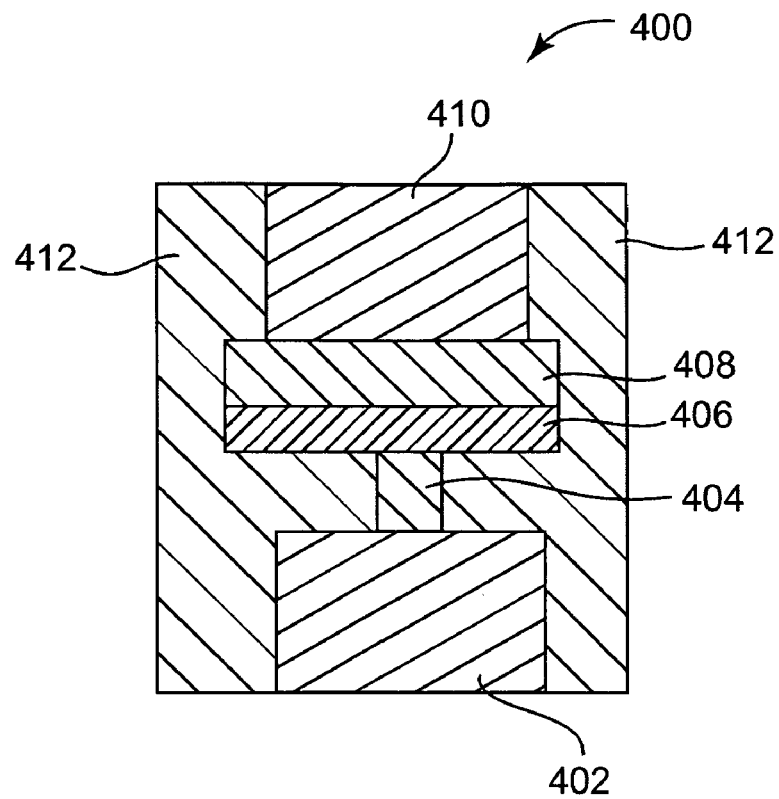
FIG. 16 is a diagram illustrating a cross-sectional view of one embodiment of a phase change element.

FIG. 16 is a diagram illustrating a cross-sectional view of one embodiment of a phase change element 400. In one embodiment, phase change element 400 is a mushroom phase change element. Phase change element 400 includes a first electrode 402, a first contact 404, phase change material 406, a second contact 408, a second electrode 410, and insulation material 412. Phase change material 406 provides a storage location for storing one or more bits of data. First electrode 402 contacts one side of first contact 404. The other side of first contact 404 contacts one side of phase change material 406. The other side of phase change material 406 contacts one side of second contact 408, and the other side of second contact 408 contacts one side of second electrode 410. Insulation material 412 laterally encloses first electrode 402, first contact 404, phase change material 406, second contact 408, and second electrode 410.

In one embodiment, contact 404 is a heater contact and has a smaller cross-sectional width than phase change material 406. In one embodiment, phase change material 406 has the same cross-sectional width as second contact 408. In one embodiment, each of first phase change elements 330 and second phase change elements 331 are similar to phase change element 400. In one embodiment, first electrode 402 is contact 308 or 310 (FIG. 13) or contact 308a or 310a (FIG. 14), and second electrode 410 is contact 308b or 310b (FIG. 14).

Insulation material 412 can be any suitable insulator, such as $SiO_2$, $SiO_x$, SiN, fluorinated silica glass (FSG), boro-phosphorous silicate glass (BPSG), boro-silicate glass (BSG), or low-k material. First electrode 402, second electrode 410, first contact 404, and second contact 408 can be any suitable electrode material, such as TiN, TaN, W, Al, TiSiN, TiAlN, TaSiN, TaAlN, WN, or Cu.

Phase change material 406 may be made up of a variety of materials in accordance with the present invention. Generally, chalcogenide alloys that contain one or more elements from group VI of the periodic table are useful as such materials. In one embodiment, phase change material 406 of memory cell 400 is made up of a chalcogenide compound material, such as GeSbTe, SbTe, GeTe, or AgInSbTe. In another embodiment, phase change material 406 is chalcogen free, such as GeSb, GaSb, InSb, or GeGaInSb. In other embodiments, phase change material 406 is made up of any suitable material including one or more of the elements Ge, Sb, Te, Ga, As, In, Se, and S.

A transistor 334 is electrically coupled to first electrode 402 or second electrode 410 to control the application of current or voltage pulses to the other of first electrode 402 or second electrode 410, and thus to first contact 404 or second contact 408 and phase change material 406, to SET and RESET phase change material 406. During operation of phase change element 400, current or voltage pulses are applied between first electrode 402 and second electrode 410 to program phase change element 400. During a SET operation of phase change element 400, a set current or voltage pulse is selectively enabled to first electrode 402 and sent through first contact 404 and phase change material 406 thereby heating the phase change material above its crystallization temperature (but usually below its melting temperature). In this way, phase change material 406 reaches a crystalline state or a partially crystalline and partially amorphous state during the SET operation. During a RESET operation of phase change element 400, a reset current or voltage pulse is selectively enabled to first electrode 402 and sent through first contact 404 and phase change material 406. The reset current or voltage quickly heats phase change material 406 above its melting temperature. After the current or voltage pulse is turned off, phase change material 406 quickly quench cools into an amorphous state or a partially amorphous and partially crystalline state.

Figure 17:
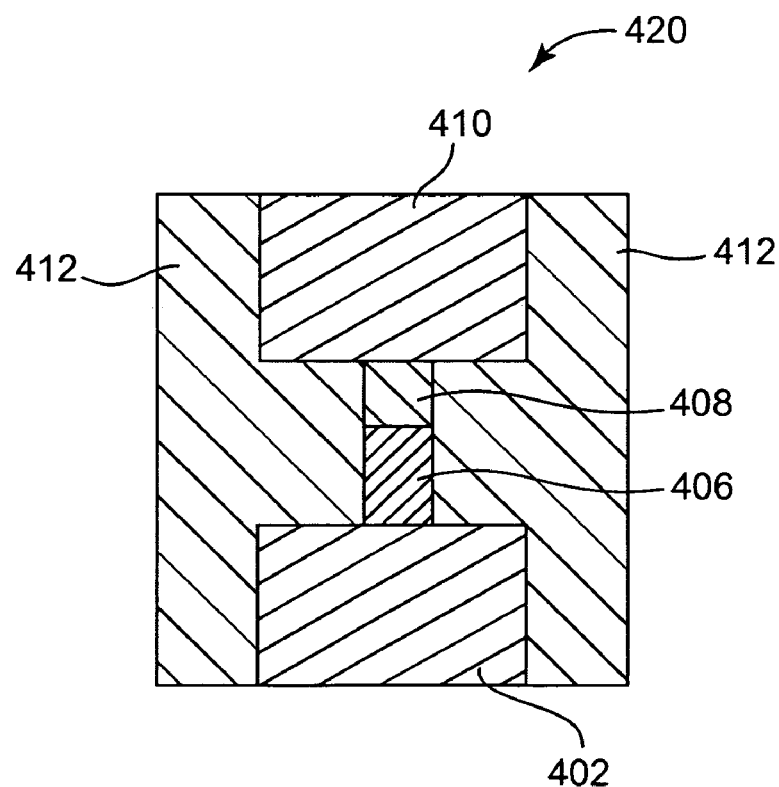
FIG. 17 is a diagram illustrating a cross-sectional view of another embodiment of a phase change element.

FIG. 17 is a diagram illustrating a cross-sectional view of another embodiment of a phase change element 420. In one embodiment, phase change element 420 is a pillar phase change element. Phase change element 420 includes a first electrode 402, phase change material 406, a contact 408, a second electrode 410, and insulation material 412. Phase change material 406 provides a storage location for storing one or more bits of data. First electrode 402 contacts one side of phase change material 406. The other side of phase change material 406 contacts one side of contact 408, and the other side of contact 408 contacts one side of second electrode 410. Insulation material 412 laterally encloses first electrode 402, phase change material 406, contact 408, and second electrode 410.

In one embodiment, contact 408 has the same cross-sectional width as phase change material 406. In one embodiment, phase change material 406 and contact 408 have smaller cross-sectional widths than first electrode 402 and second electrode 410. In one embodiment, phase change material 406 and contact 408 are formed by depositing a layer of phase change material and a layer of contact material and then etching the layer of contact material and the layer of phase change material. In one embodiment, each of first phase change elements 330 and second phase change elements 331 are similar to phase change element 420. In one embodiment, first electrode 402 is contact 308 or 310 (FIG. 13) or contact 308a or 310a (FIG. 14), and second electrode 410 is contact 308b or 310b (FIG. 14).

A transistor 334 is electrically coupled to first electrode 402 or second electrode 410 to control the application of current or voltage pulses to the other of first electrode 402 or second electrode 410, and thus to contact 408 and phase change material 406, to SET and RESET phase change material 406. During operation of phase change element 420, current or voltage pulses are applied between first electrode 402 and second electrode 410 to program phase change element 420. During a SET operation of phase change element 420, a set current or voltage pulse is selectively enabled to first electrode 402 and sent through phase change material 406 thereby heating it above its crystallization temperature (but usually below its melting temperature). In this way, phase change material 406 reaches a crystalline state or a partially crystalline and partially amorphous state during the SET operation. During a RESET operation of phase change element 420, a reset current or voltage pulse is selectively enabled to first electrode 402 and sent through phase change material 406. The reset current or voltage quickly heats phase change material 406 above its melting temperature. After the current or voltage pulse is turned off, phase change material 406 quickly quench cools into an amorphous state or a partially amorphous and partially crystalline state.

Figure 18:
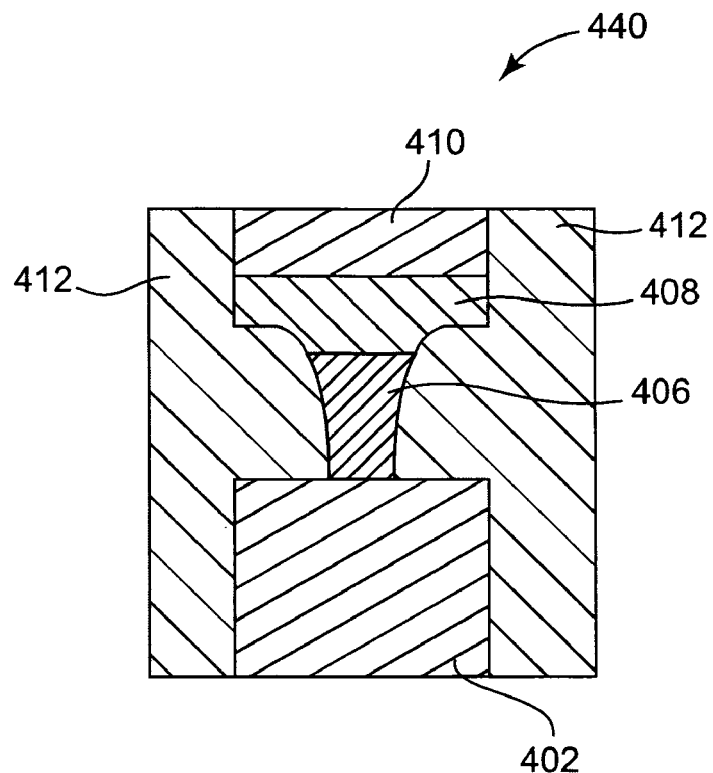
FIG. 18 is a diagram illustrating a cross-sectional view of another embodiment of a phase change element.

FIG. 18 illustrates a cross-sectional view of another embodiment of a phase change element 440. In one embodiment, phase change element 440 is a via or pore phase change element. Phase change element 440 includes a first electrode 402, phase change material 406, a contact 408, a second electrode 410, and insulation material 412. Phase change material 406 provides a storage location for storing one or more bits of data. First electrode 402 contacts one side of phase change material 406. The other side of phase change material 406 contacts one side of contact 408, and the other side of contact 408 contacts one side of second electrode 410.

Insulation material 412 laterally encloses first electrode 402, phase change material 406, contact 408, and second electrode 410.

In one embodiment, at least a portion of contact 408 has the same cross-sectional width as second electrode 410. In one embodiment, phase change material 406 has a smaller cross-sectional width than first electrode 402 and contact 408. In one embodiment, phase change material 406 is formed by etching an opening in insulation material 412 and filling the opening with phase change material. In one embodiment, each of first phase change elements 330 and second phase change elements 331 are similar to phase change element 440. In one embodiment, first electrode 402 is contact 308 or 310 (FIG. 13) or contact 308a or 310a (FIG. 14), and second electrode 410 is contact 308b or 310b (FIG. 14).

A transistor 334 is electrically coupled to first electrode 402 or second electrode 410 to control the application of current or voltage pulses to the other of first electrode 402 or second electrode 410, and thus to contact 408 and phase change material 406, to SET and RESET phase change material 406. Phase change element 440 operates similarly to phase change element 420 previously described and illustrated with reference to FIG. 17.

Figure 19:
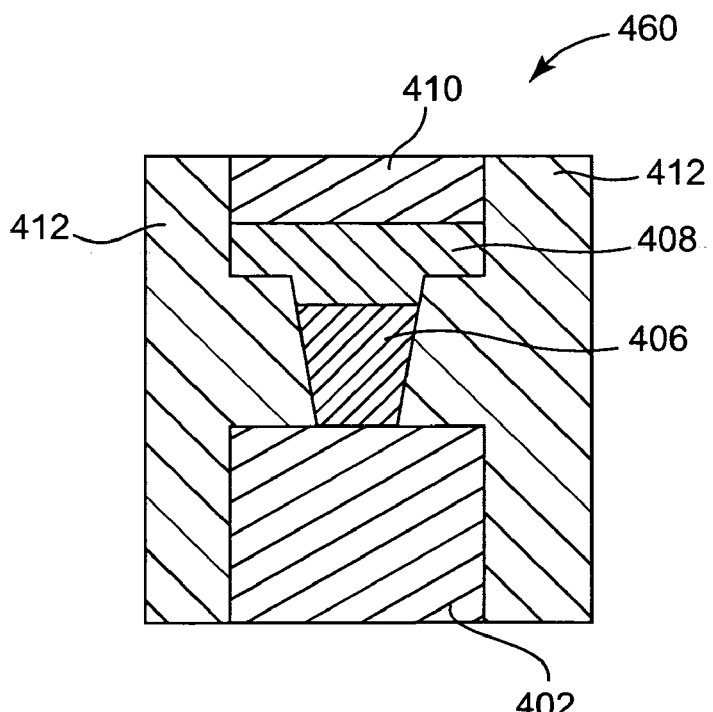
FIG. 19 is a diagram illustrating a cross-sectional view of another embodiment of a phase change element.

FIG. 19 illustrates a cross sectional view of another embodiment of a phase change element 460. In one embodiment, phase change element 460 is a V-shaped via or pore phase change element. Phase change element 460 includes a first electrode 402, phase change material 406, a contact 408, a second electrode 410, and insulation material 412. Phase change material 406 provides a storage location for storing one or more bits of data. First electrode 402 contacts one side of phase change material 406. The other side of phase change material 406 contacts one side of contact 408, and the other side of contact 408 contacts one side of second electrode 410. Insulation material 412 laterally encloses first electrode 402, phase change material 406, contact 408, and second electrode 410.

In one embodiment, at least a portion of contact 408 has the same cross-sectional width as second electrode 410. In one embodiment, phase change material 406 has smaller maximum and minimum cross-sectional widths than first electrode 402 and contact 408. In one embodiment, phase change material 406 is formed by etching a V-shaped opening in insulation material 412 and filling the opening with phase change material. In one embodiment, each of first phase change elements 330 and second phase change elements 331 are similar to phase change element 460. In one embodiment, first electrode 402 is contact 308 or 310 (FIG. 13) or contact 308a or 310a (FIG. 14), and second electrode 410 is contact 308b or 310b (FIG. 14).

A transistor 334 is electrically coupled to first electrode 402 or second electrode 410 to control the application of current or voltage pulses to the other of first electrode 402 or second electrode 410, and thus to contact 408 and phase change material 406, to SET and RESET phase change material 406. Phase change element 460 operates similarly to phase change element 420 previously described and illustrated with reference to FIG. 17.

Figure 20:
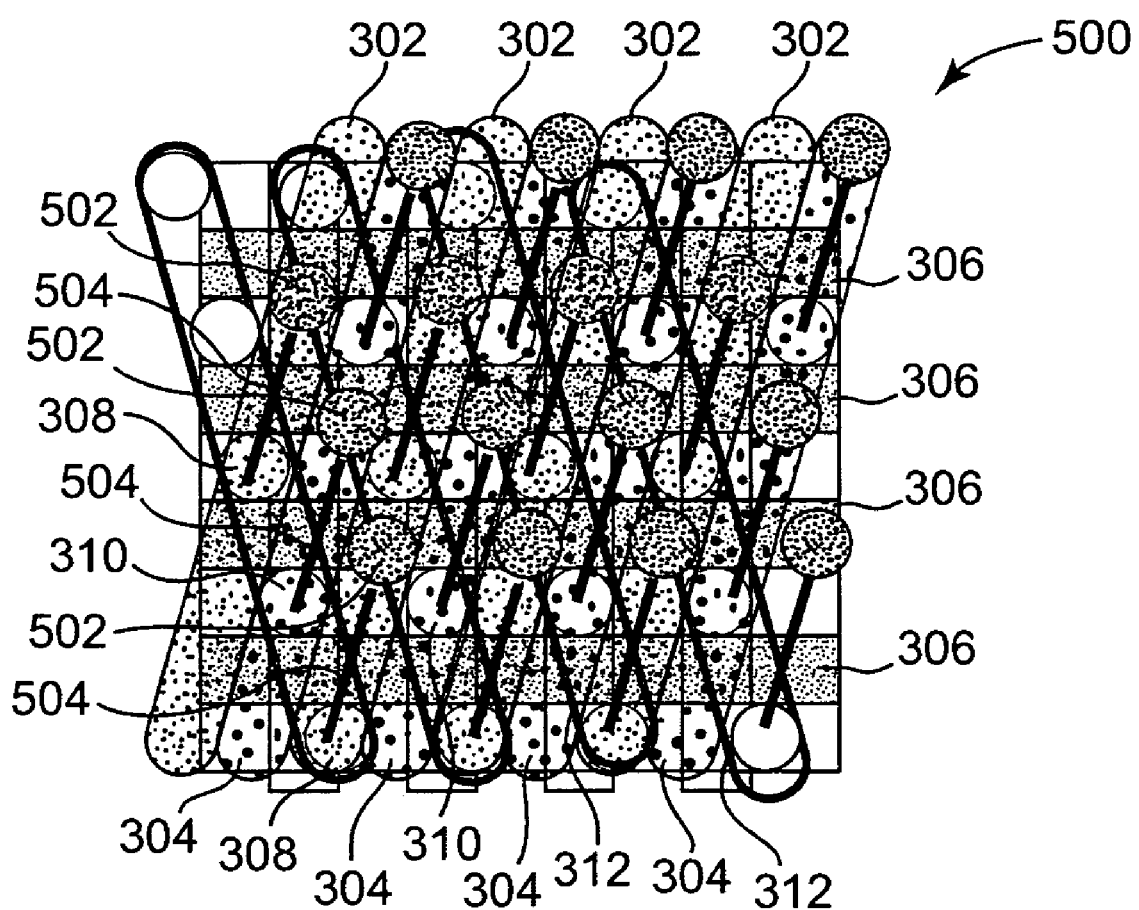
FIG. 20 is a diagram illustrating a top view of another embodiment of an array of phase change memory cells.

FIG. 20 is a diagram illustrating a top view of another embodiment of an array of phase change memory cells 500. Array of phase change memory cells 500 is similar to array of phase change memory cells 300a previously described and illustrated with reference to FIG. 11, except in array of phase change memory cells 500 line phase change elements are used. In addition to first bit lines 302, second bit lines 304, word lines 306, contacts 308, and contacts 310, array of phase change memory cells 500 also includes additional contacts 502 and line phase change elements 504. Each line phase change element 504 extends between a contact 308 and a contact 502, or between a contact 310 and a contact 502.

A line phase change element 504 is electrically coupled to one side of the source-drain path of each transistor through a contact 308 and to a first bit line 302 through a contact 502. A line phase change element 504 is electrically coupled between the other side of the source-drain path of each transistor through a contact 310 and to a second bit line 304 through a contact 502.

Figure 21:
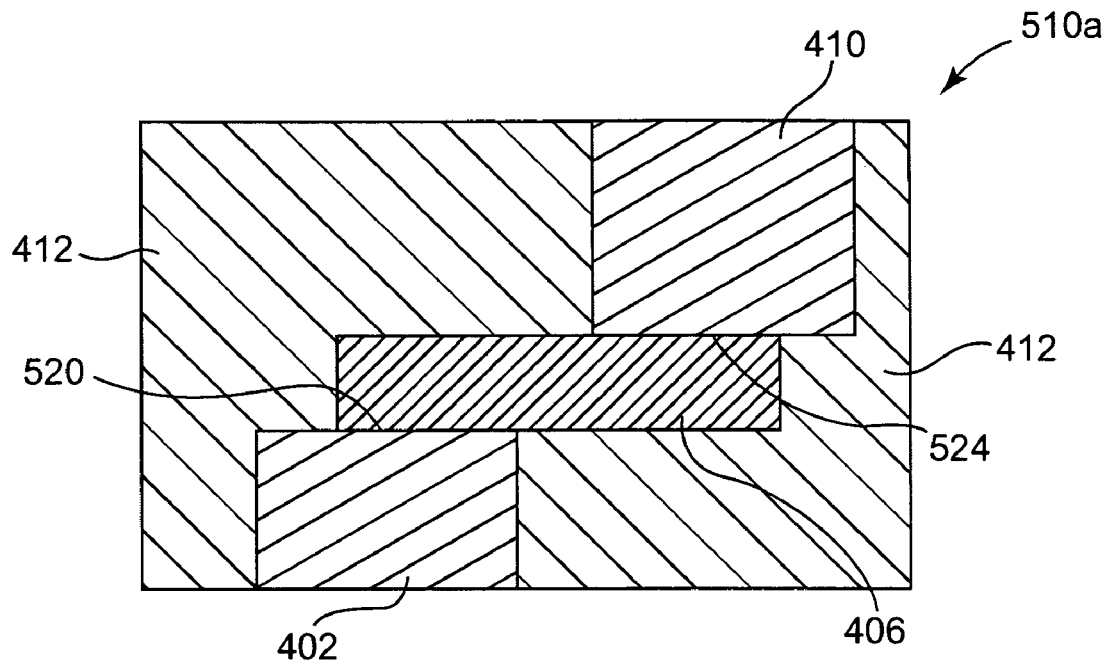
FIG. 21 is a diagram illustrating a cross-sectional view of one embodiment of a line phase change element.

FIG. 21 is a diagram illustrating a cross-sectional view of one embodiment of a line phase change element 510a. Line phase change element 510a includes a first electrode 402, phase change material 406, and a second electrode 410. At least a portion of the top surface of first electrode 402 contacts a portion of the bottom surface of phase change material 406 at 520. A portion of the top surface of phase change material 406 contacts at least a portion of the bottom surface of second electrode 410 at 524. Insulation material 412 laterally encloses first electrode 402 and second electrode 410. Insulation material 412 also encloses phase change material 406. In one embodiment, line phase change elements 504 are similar to line phase change element 510a. In one embodiment, first electrode 402 is contact 308 or 310 (FIG. 20), and second electrode 410 is contact 502 (FIG. 20).

A transistor 334 is electrically coupled to first electrode 402 or second electrode 410 to control the application of current or voltage pulses to the other of first electrode 402 or second electrode 410, and thus to contact 408 and phase change material 406, to SET and RESET phase change material 406. During operation of line phase change element 510a, current or voltage pulses are applied between first electrode 402 and second electrode 410 to program line phase change element 510a. During a SET operation of line phase change element 510a, a set current or voltage pulse is selectively enabled to first electrode 402 and sent through phase change material 406 thereby heating it above its crystallization temperature (but usually below its melting temperature). In this way, phase change material 406 reaches a crystalline state or a partially crystalline and partially amorphous state during the SET operation. During a RESET operation of line phase change element 510a, a reset current or voltage pulse is selectively enabled to first electrode 402 and sent through phase change material 406. The reset current or voltage quickly heats phase change material 406 above its melting temperature. After the current or voltage pulse is turned off, phase change material 406 quickly quench cools into an amorphous state or a partially amorphous and partially crystalline state.

Figure 22:
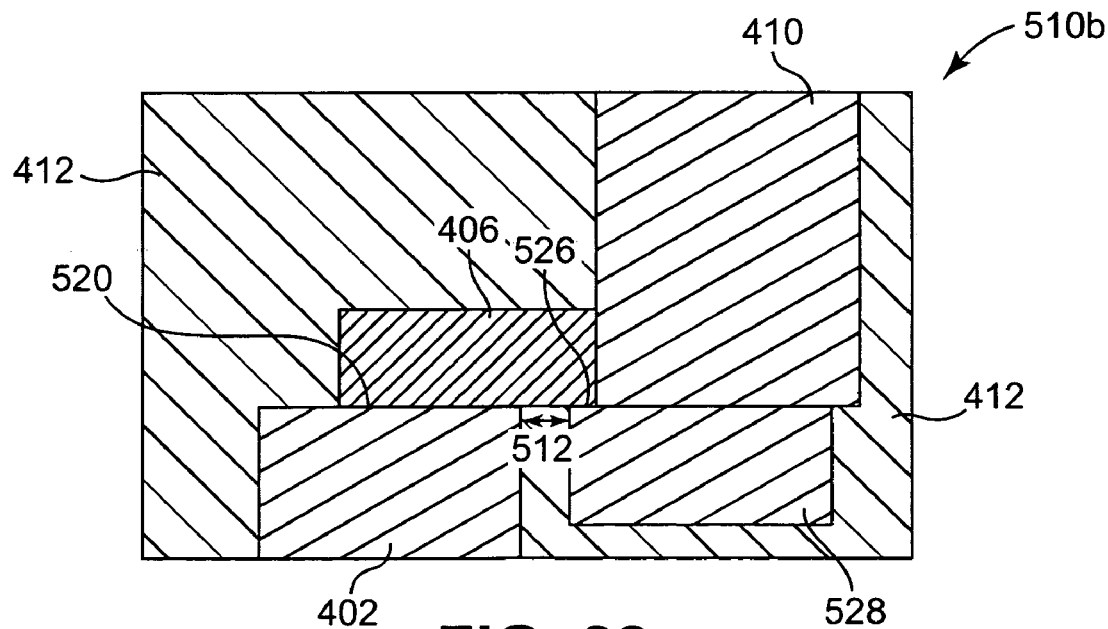
FIG. 22 is a diagram illustrating a cross-sectional view of another embodiment of a line phase change element.

FIG. 22 is a diagram illustrating a cross-sectional view of another embodiment of a line phase change element 510b. Line phase change element 510b includes a first electrode 402, phase change material 406, a contact 528, and a second electrode 410. At least a portion of the top surface of first electrode 402 contacts a portion of the bottom surface of phase change material 406 at 520. A portion of the bottom surface of phase change material 406 contacts a portion of the top surface of contact 528 at 526. Contact 528 contacts second electrode 410. Insulation material 412 laterally encloses first electrode 402 and second electrode 410. Insulation material 412 also encloses phase change material 406 and contact 528.

In one embodiment, the distance 512 between first electrode 402 and contact 528 defining the phase change region in phase change material 406 is defined by a spacer. In one embodiment, line phase change elements 504 are similar to line phase change element 510b. In one embodiment, first electrode 402 is contact 308 or 310 (FIG. 20), and second electrode 410 is contact 502 (FIG. 20).

A transistor 334 is electrically coupled to first electrode 402 or second electrode 410 to control the application of current or voltage pulses to the other of first electrode 402 or second electrode 410, and thus to contact 528 and phase change material 406, to SET and RESET phase change material 406. Line phase change element 510b operates similarly to line phase change element 510a previously described and illustrated with reference to FIG. 21.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A memory device comprising:
    a first bit line in a first conducting layer;
    a second bit line parallel to the first bit line, the second bit line in a second conducting layer;
    a third bit line parallel to the first bit line, the third bit line in the first conducting layer;
    a first MOS select transistor;
    a second MOS select transistor sharing a source with the first MOS select transistor;
    a third MOS select transistor sharing a drain with the first MOS select transistor;
    a word line coupled to a gate of the first MOS select transistor, the word line at an angle with respect to the first bit line and the second bit line;
    a first resistive memory element coupled between the shared source of the first MOS select transistor and the second bit line;
    a second resistive memory element coupled between the shared drain of the first MOS select transistor and the third bit line; and
    a third resistive memory element coupled between a drain of the second MOS select transistor and the first bit line.

2. The memory device of claim 1, wherein the first resistive memory element comprises a first phase change element, and wherein the second resistive memory element comprises a second phase change element.

3. The memory device of claim 1, wherein the word line is perpendicular to the first bit line and the second bit line.

4. The memory device of claim 1, wherein the first resistive memory element and the second resistive memory element are in the same level of the memory device.

5. The memory device of claim 1, wherein the first resistive memory element is in a different level of the memory device than the second resistive memory element.

6. The memory device of claim 2, wherein the first phase change element and the second phase change element comprise heater phase change elements.

7. The memory device of claim 2, wherein the first phase change element and the second phase change element comprise via phase change elements.

8. The memory device of claim 2, wherein the first phase change element and the second phase change element comprise pillar phase change elements.

9. The memory device of claim 2, wherein the first phase change element and the second phase change element comprise line phase change elements.

10. A memory device comprising:
    a first, a second, and a third MOS select transistor, the second MOS select transistor sharing a source with the first MOS select transistor and the third MOS select transistor sharing a drain with the first MOS select transistor;
    a plurality of word lines, each word line coupled to a gate of a MOS select transistor;
    a first phase change element and a second phase change element, the first phase change element coupled to the shared drain of the first MOS select transistor and the second phase change element coupled to a drain of the second MOS select transistor;
    a third phase change element, coupled to the shared source of the first MOS select transistor;
    a first bit line and a second bit line, the first bit line couple to the first phase change element and in a first conducting layer and the second bit line coupled to the second phase change element and in the first conducting layer;
    a third bit line parallel to the first bit line, the third bit line coupled to the third phase change element and in a second conducting layer,
    wherein the first, the second, and the third bit lines are at an angle to the word lines.

11. The memory device of claim 10, wherein the word lines are perpendicular to the first, the second, and the third bit lines.

12. The memory device of claim 10, wherein the first, the second, and the third phase change elements are in the same level of the memory device.

13. The memory device of claim 10, wherein the first phase change element and the second phase change element are in a different level of the memory device than the third phase change element.

14. The memory device of claim 10, wherein the first, the second, and the third phase change elements comprise heater phase change elements.

15. The memory device of claim 10, wherein the first, the second, and the third phase change elements comprise via phase change elements.

16. The memory device of claim 10, wherein the first, the second, and the third phase change elements comprise pillar phase change elements.

17. The memory device of claim 10, wherein the first, the second, and the third phase change elements comprise line phase change elements.

18. A method for fabricating a memory device, the method comprising:
    providing a first bit line in a first conducting layer;
    providing a second bit line parallel to the first bit line and in a second conducting layer;

providing a third bit line parallel to the first bit line and in the first conducting layer;

providing a first MOS select transistor;

providing a second MOS select transistor sharing a source with the first MOS select transistor;

providing a third MOS select transistor sharing a drain with the first MOS select transistor;

providing a word line coupled to a gate of the first MOS select transistor, the word line at an angle with respect to the first bit line and the second bit line;

providing a first phase change element coupled between the shared source of the first MOS select transistor and the second bit line;

providing a second phase change element coupled between the shared drain of the first MOS select transistor and the third bit line; and providing a third phase change element coupled between a drain of the second MOS select transistor and the first bit line.

19. The method of claim 18, wherein providing the word line comprises providing the word line perpendicular to the first bit line and the second bit line.

20. The method of claim 18, wherein providing the second phase change element comprises providing the second phase change element in the same level of the memory device as the first phase change element.

21. The method of claim 18, wherein providing the second phase change element comprises providing the second phase change element in a different level of the memory device than the first phase change element.

22. The method of claim 18, wherein providing the first phase change element and providing the second phase change element comprise providing heater phase change elements.

23. The method of claim 18, wherein providing the first phase change element and providing the second phase change element comprise providing via phase change elements.

24. The method of claim 18, wherein providing the first phase change element and providing the second phase change element comprise providing pillar phase change elements.

25. The method of claim 18, wherein providing the first phase change element and providing the second phase change element comprise providing line phase change elements.

* * * * *